(12) United States Patent
Yamaguchi

(10) Patent No.: US 6,222,710 B1
(45) Date of Patent: *Apr. 24, 2001

(54) SEMICONDUCTOR DEVICE

(75) Inventor: Yasuo Yamaguchi, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,144

(22) Filed: Mar. 11, 1998

(30) Foreign Application Priority Data

Sep. 12, 1997 (JP) .................................................. 9-248372

(51) Int. Cl.$^7$ ...................................................... H02H 9/00
(52) U.S. Cl. .......................... 361/56; 361/91.1; 361/111; 361/115
(58) Field of Search .......................... 361/56, 58, 91.1, 361/111, 117, 118, 127, 115

(56) References Cited

U.S. PATENT DOCUMENTS

| | | | |
|---|---|---|---|
| 4,989,057 | 1/1991 | Lu | 357/23.7 |
| 5,489,792 | 2/1996 | Hu et al. | 257/347 |
| 5,610,426 | 3/1997 | Asai et al. | 361/56 |
| 5,610,790 | 3/1997 | Staab et al. | 361/56 |

FOREIGN PATENT DOCUMENTS

| | | |
|---|---|---|
| 0 444 686 | 9/1991 | (EP) . |
| 0 471 310 | 2/1992 | (EP) . |
| 2-260459 | 10/1990 | (JP) . |
| 02260459 | 11/1990 | (JP) . |
| 07202010 | 8/1995 | (JP) . |
| 7-202010 | 8/1995 | (JP) . |
| 08031948 | 2/1996 | (JP) . |
| 08181219 | 7/1996 | (JP) . |
| WO 96/22613 | 7/1996 | (WO) . |

Primary Examiner—Stephen W. Jackson
(74) Attorney, Agent, or Firm—Oblon, Spivak, McClelland, Maier & Neustadt, P.C.

(57) ABSTRACT

A semiconductor device of SOI structure with improved ESD resistance is provided. In an I/O protection circuit of a semiconductor device of SOI structure, each unit channel width resistance value of drain resistance of a plurality of NMOS transistors, each being provided in parallel to an external terminal by a reverse bias connection, is set to have an HBM surge resistance voltage equal to that in a forward bias connection.

20 Claims, 14 Drawing Sheets

BACKGROUND ART  F I G. 2 3
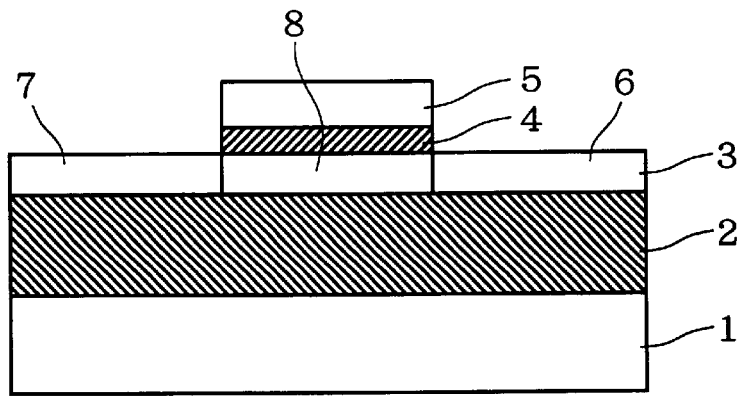
BACKGROUND ART  F I G. 2 4
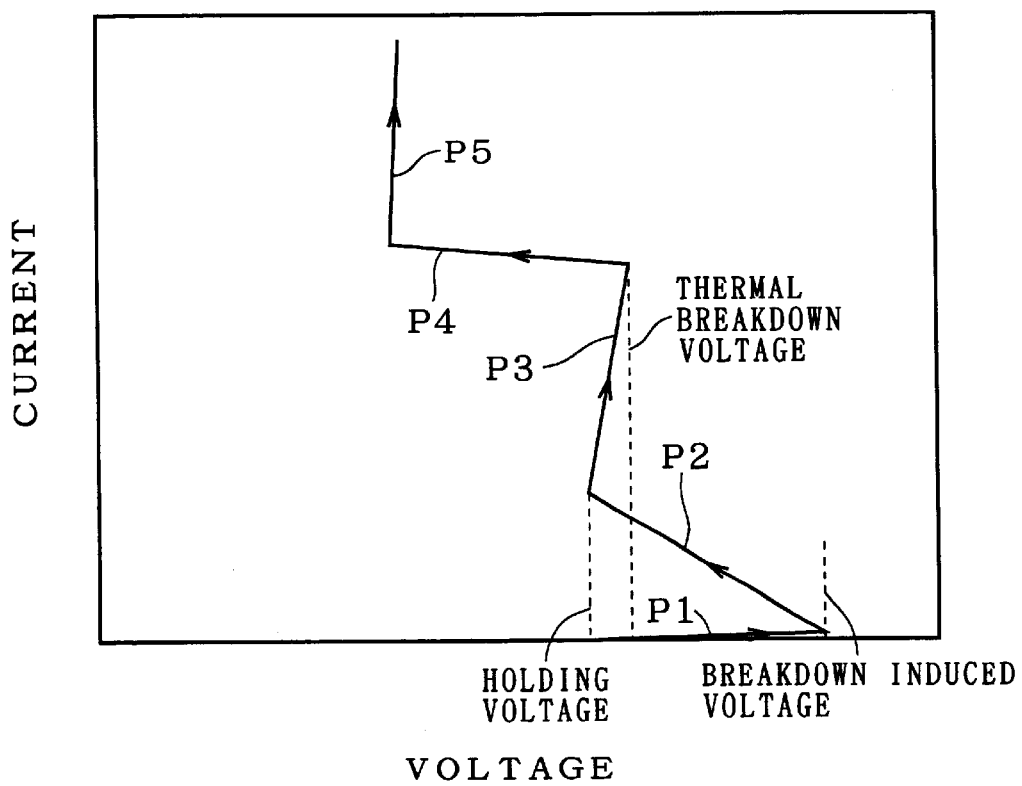

BACKGROUND ART FIG. 25
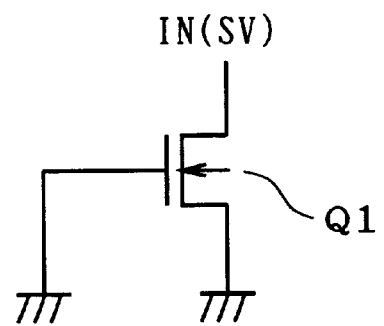
BACKGROUND ART FIG. 26
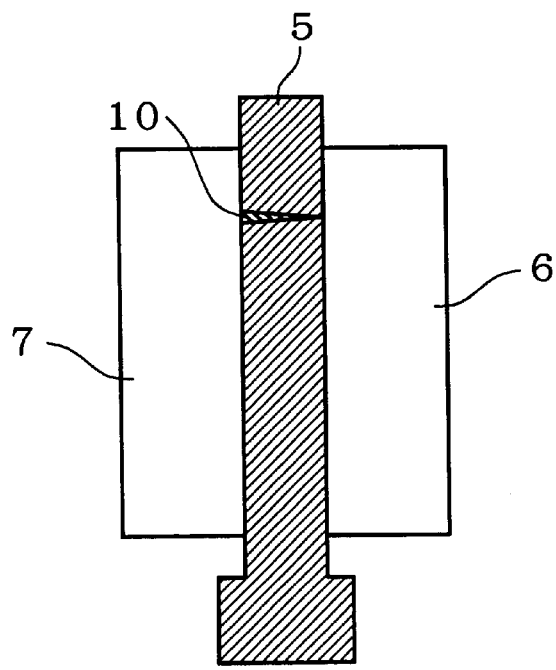

BACKGROUND ART FIG. 27
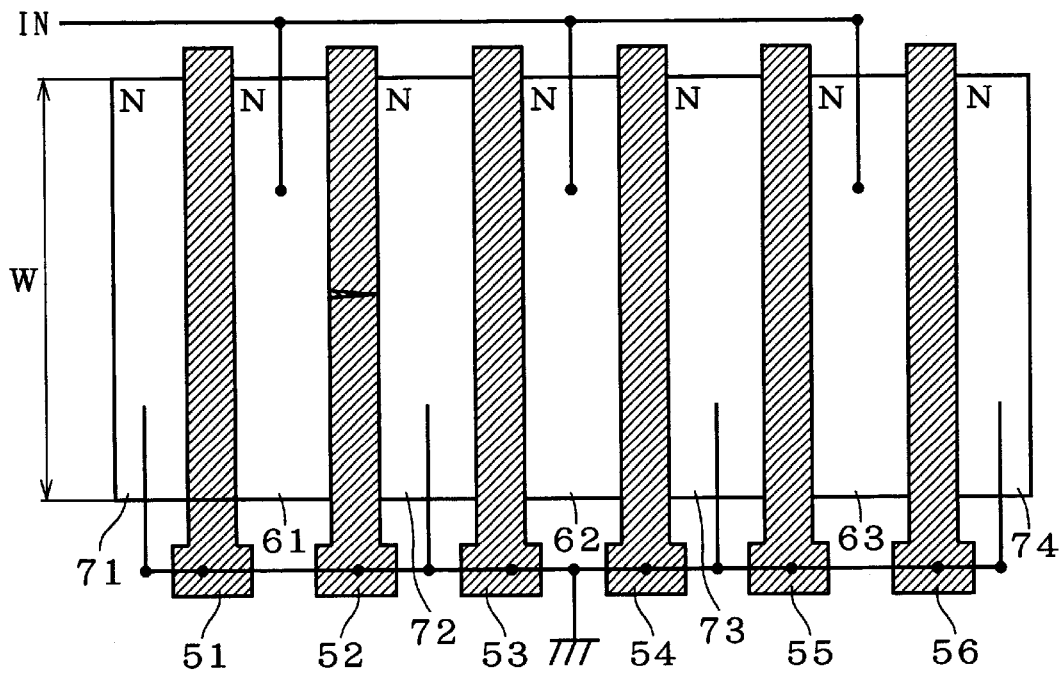
BACKGROUND ART FIG. 28

SEMICONDUCTOR DEVICE

BACKGROUND OF THE INVENTION

1. Field of the Invention

The present invention relates to a semiconductor device comprising an MOS transistor formed on an SOI (silicon (semiconductor)-on-insulator) substrate and, in particular, to its I/O protection function.

2. Description of the Background Art

In MOS transistors formed on SOI substrates in which a silicon thin film is formed on an insulating substrate (referred to as "SOI device" in some cases), its source and drain regions reach the insulating substrate so that each junction capacity is reduced, permitting high speed and low dissipation power operation.

Specifically, in MOS transistors formed on normal bulk silicon substrates (referring to as "substrate device" in some cases), the respective junction capacity of drain and source regions is increased at low voltages and its performance (particularly, operation speed) is extremely lowered. On the other hand, since SOI devices have less components for the respective junction capacity of drain and source regions, so that they have little performance degradation, permitting high speed and low dissipation power operation.

As described, since SOI devices provide high speed and low dissipation power operation, they are highly anticipated to be utilized as devices for portable apparatuses.

Although SOI devices are expected to be used as devices for low-voltage operation, they have poor ESD (Electro Static Discharge) resistance in I/O protection circuits. The reason for being called I/O protection circuit is that a surge voltage can be applied from output terminals as well as input terminals.

FIG. 23 is a sectional view of an SOI structure. As shown in the figure, a buried oxide film 2 is formed on a semiconductor substrate 1, and an SOI layer 3 is formed on the oxide film 2. The structure comprising the semiconductor substrate 1, the buried oxide film 2, and the SOI layer 3, is called SOI substrate. A gate oxide film 4 is selectively formed on the SOI layer 3, and a gate electrode 5 is formed on the gate oxide film 4. The SOI layer 3 underlying the gate oxide film 4 serves as a channel region 8, and regions of the SOI layer 3 adjacent to the channel region 8 serve as a drain region 6 and a source region 7.

In the above SOI structure, heat generated when applied a surge voltage is accumulated by the presence of the buried oxide film 2 whose thermal conductivity is poor (about one-tenth of that of silicon). It is therefore liable to cause a thermal runaway or 2nd breakdown, resulting in permanent breakage of semiconductor devices on SOI substrates.

FIG. 24 is a graph diagram showing a process of a thermal runaway. This figure shows a process of a thermal runaway at the time of reverse bias connection, e.g., when an input voltage (surge voltage SV) is applied to a drain of an NMOS transistor Q1 whose source and gate are grounded as shown in FIG. 25. The thermal runaway process of FIG. 24 comprises subprocesses P1 to P5.

When a surge voltage SV far beyond ordinary ones is applied to the drain of the NMOS transistor Q1 in FIG. 25, its drain voltage rises rapidly (P1) and reaches a breakdown induced voltage. Then, the transistor Q1 causes an avalanche breakdown so that the current begins to flow, lowering to a holding voltage temporarily (P2). Thereafter, it starts to rise again (P3) and, when it reaches a thermal breakdown voltage, portions of the transistor Q1 become a melted state so that the resistance value between the source and drain is rapidly lowered, causing a rapid voltage drop (P4). The flow of current concentrates on the transistor Q1 that has caused such a rapid drop of resistance value between the source and drain, that is, a positive feedback is effected (P5). As a result, the transistor Q1 is completely broken. For instance, as shown in FIG. 26, a large defect 10 due to the thermal breakdown occurs in the gate electrode 5, thereby making the transistor operation impossible.

Generally, in cases where, as an I/O protection circuit on an SOI substrate, NMOS transistors are provided by a reverse bias, NMOS transistors having a channel width W are connected in parallel between an input (voltage) IN and a ground level as shown in FIG. 27. In the case of FIG. 27, six NMOS transistors T1 to T6 whose gate is grounded are provided in parallel between an input IN and a ground level as shown in FIG. 28. The NMOS transistor T1 comprises a gate electrode 51, a drain region 61, and a source region 71. The NMOS transistor T2 comprises a gate electrode 52, a drain region 61, and a source region 72. The NMOS transistor T3 comprises a gate electrode 53, a drain region 62, and a source region 72. The NMOS transistor T4 comprises a gate electrode 54, a drain region 62, and a source region 73. The NMOS transistor T5 comprises a gate electrode 55, a drain region 63, and a source region 73. The NMOS transistor T6 comprises a gate electrode 56, a drain region 63, and a source region 74. The input voltage IN as a surge voltage is input from an external input terminal or an external output terminal.

Providing the six NMOS transistors T1 to T6 in parallel between the input IN and the ground level as an I/O protection circuit on an SOI substrate, enables to distribute the current into the transistors T1 to T6 when the current flows between the input IN and the ground level.

If, however, one of the NMOS transistors T1 to T6 causes an avalanche breakdown and reaches a thermal breakdown voltage, a resistance value between the source and drain of such a transistor is rapidly lowered. As shown in a subprocess P5 in FIG. 24, the flow of current concentrates on such a transistor that has reached a thermal breakdown voltage, failing to suppress this transistor from being broken.

Thus, with the I/O protection circuit utilizing the NMOS transistors of the conventional SOI structure, even if, in order to improve a surge resistance, a plurality of NMOS transistors in parallel connection constitute an I/O protection circuit as shown in FIG. 27, expected improvement in ESD resistance cannot be accomplished.

SUMMARY OF THE INVENTON

According to a first aspect of the present invention, a semiconductor device formed on an SOI substrate has an I/O protection circuit portion including at least one first MOS transistor connected to an external terminal by a forward bias, and a plurality of second MOS transistors connected in parallel to the external terminal by a reverse bias. In this semiconductor device, a resistance value of each drain resistance of the plurality of second MOS transistors is set so that an ESD (Electro Static Discharge) resistance of the plurality of second MOS transistors is approximately equal to or greater than that of the at least one first MOS transistor.

According to a second aspect of the invention, the semiconductor device of the first aspect further comprises an internal circuit portion that performs signal processing based on signals from the external terminal. In this semiconductor device, the internal circuit includes an MOS transistor for internal circuit having a conductivity type identical with that of the plurality of second MOS transistors, and the MOS transistor for internal circuit has a drain resistance whose resistance value is smaller than that of each drain resistance of the plurality of second MOS transistors.

According to a third aspect of the invention, in the semiconductor device of the second aspect, a plurality of first silicide layers are respectively provided on drain regions of the plurality of second MOS transistors, a second silicide layer is provided on a drain region of the MOS transistor for internal circuit, and the first silicide layer is thinner in thickness than the second silicide layer.

According to a fourth aspect of the invention, in the semiconductor device of the first aspect, the conductivity type of the at least one first MOS transistor and the plurality of second MOS transistors is n-type.

According to a fifth aspect of the invention, in the semiconductor device of the fourth aspect, each resistance value of the plurality of second MOS transistors is not less than 30 Ω per 1 μm of channel width.

According to a sixth aspect of the invention, a semiconductor device formed on an SOI substrate has an I/O protection circuit portion connecting an MOS transistor for I/O protection to an external terminal, and an internal circuit comprising an MOS transistor for internal circuit to perform a prescribed signal processing therein. In this semiconductor device, a drain region of the MOS transistor for I/O protection has first regions upon which no silicide layer is formed, and a second region upon which a silicide layer is formed and a drain region of the MOS transistor for internal circuit has a third region upon which a silicide layer is formed; the first regions being higher in impurity concentration than the third region.

According to a seventh aspect of the invention, the semiconductor device of the sixth aspect is characterized in that the second region is lower in impurity concentration than the first regions.

According to an eighth aspect of the invention, a semiconductor device formed on an SOI substrate has an I/O protection circuit portion connecting a PMOS transistor for I/O protection to an external terminal. In this semiconductor device, the channel region property of said PMOS transistor is set to improve an ESD resistance of the PMOS transistor without affecting an integration degree.

According to a ninth aspect of the invention, the semiconductor device of the eighth aspect is characterized in that the I/O protection circuit portion further includes an NMOS transistor for I/O protection, and a channel length of the PMOS transistor for I/O protection is shorter than a channel length of the NMOS transistor for I/O protection.

According to a tenth aspect of the invention, the semiconductor device of the eighth aspect further comprises an internal circuit portion including a PMOS transistor for internal circuit to perform signal processing therein. In this semiconductor device, portions adjacent to a channel region in a drain region of the PMOS transistor for I/O protection is higher in impurity concentration than portions adjacent to a channel region in a drain region of the PMOS transistor for internal circuit.

According to an eleventh aspect of the invention, the semiconductor device of the eight aspect further comprises an internal circuit portion having a PMOS transistor for internal circuit to perform signal processing therein. In this semiconductor device, the PMOS transistor for I/O protection is shorter in channel length than the PMOS transistor for internal circuit.

According to a twelfth aspect of the invention, a semiconductor device formed on an SOI substrate has an I/O protection circuit corresponding to an external terminal. The I/O protection circuit has only NMOS transistors connected between a power supply and a ground level.

According to a thirteenth aspect of the invention, a semiconductor device formed on an SOI substrate has an I/O protection circuit corresponding to an external terminal, and further includes a power supply wire connected to a power supply in common and a ground wire connected to a ground level in common. In this semiconductor device, the I/O protection circuit includes an NMOS transistor in a diode connection between the power supply wire and the ground wire, and an MOS transistor for I/O protection provided between the external terminal and at least one of the power supply wire and the ground wire.

According to a fourteenth aspect of the invention, the semiconductor device of the thirteenth aspect further comprises a capacitor provided between the power supply wire and the ground wire of the I/O protection circuit portion.

In the semiconductor device of the first aspect, in order that the ESD resistance due to a plurality of second MOS transistors connected by a reverse bias is approximately equal to or greater than the ESD resistance due to at least one of first MOS transistors connected by a forward bias, the resistance value of drain resistance of the second MOS transistors is set respectively. It is therefore possible to obtain I/O protection circuits that exhibit excellent ESD resistance in both forward and reverse connections of the MOS transistors.

In the semiconductor device of the second aspect, the MOS transistor for internal circuit has a smaller resistance value of drain resistance than each drain resistance of the plurality of second MOS transistors. This prevents the drive capability of the MOS transistor for internal circuit from lowering than necessary.

In the semiconductor device of the third aspect, by decreasing the film thickness of a plurality of first silicide layers in the MOS transistor for I/O protection than that of the second silicide layer in the MOS transistor for internal circuit, the drain resistance of the MOS transistor for I/O protection can be increased than that of the MOS transistor for internal circuit. It is therefore possible to increase the resistance value of drain resistance due to the second MOS transistors in the I/O protection circuit so as to have an ESD resistance approximately equal to that due to at least one fist MOS transistor, and also to decrease the resistance value of drain resistance of the MOS transistor for internal circuit so as to obtain a desired drive capability.

In the semiconductor device of the fourth aspect, the conductivity type of at least one first MOS transistor and a plurality of second MOS transistors is n-type. NMOS transistors produce a snap back phenomenon that at the time of reverse bias connection, its drain voltage reaches a breakdown induced voltage to cause an avalanche breakdown so that the resistance value between the source and drain is lowered and the drain voltage is then lowered. This results in the problem that the flow of current concentrates on an NMOS transistor that has caused an avalanche breakdown for the first time to reduce the resistance value between the source and drain, leading to a thermal breakdown. However, by increasing the each resistance value of drain resistance of the plurality of second MOS transistor so as to have an ESD resistance approximately equal to that of at least one first MOS transistor, it is possible to suppress a reduction in resistance value between the source and drain because of the snap back phenomenon, thereby avoiding the above problem.

In the semiconductor device of the fifth aspect, by setting each resistance value of a plurality of second NMOS transistor per 1 μm of channel width to 30 Ω or more, it is possible to obtain an ESD resistance approximately equal to that of at least one first MOS transistor connected by a forward bias.

In the semiconductor device of the sixth aspect, the impurity concentration of the first region upon which no silicide layer is formed in the MOS transistor for I/O protection, is higher than that of the third region upon which the silicide layer is formed in the MOS transistor for internal circuit. By decreasing the resistance value of the first region, transistors for I/O protection circuit having a high drive capability can be obtained.

In the semiconductor device of the seventh aspect, the impurity concentration of a second region upon which the silicide layer is formed in the MOS transistor for I/O protection, is lower than that of the first region upon which no silicdie layer is formed, thus exerting no harmful effect on the silicide layer formed in the first region, irrespective of the impurity concentration of the second region.

In the semiconductor device of the eighth aspect, the channel region property of the PMOS transistor is set to improve the ESD resistance without affecting the integration degree of the PMOS transistors for I/O protection. This enables to improve the ESD resistance of PMOS transistors that are generally inferior to NMOS transistors in ESD resistance, thus reducing a difference in ESD resistance between the PMOS transistors for I/O protection and the NMOS transistors for I/O protection. This permits the I/O protection circuits whose ESD resistance does not deteriorate even if PMOS transistors are used.

In the semiconductor device of the ninth aspect, the channel length of the PMOS transistor for I/O protection is shorter than that of the NMOS transistor for I/O protection. This enables to lower the breakdown induced voltage so that the ESD resistance is improved without affecting the integration degree.

In the semiconductor device of the tenth aspect, the impurity concentration of portions adjacent to the channel region in the drain region of the PMOS transistor for I/O protection is higher than that of portions adjacent to the channel region in the drain region of the PMOS transistor for internal circuit. This enables to lower the breakdown induced voltage so that the ESD resistance is improved without affecting the integration degree.

In the semiconductor device of the eleventh aspect, the channel length of the PMOS transistor for internal circuit is shorter than that of the PMOS transistor for I/O protection. This enables to lower the breakdown induced voltage so that the ESD resistance is improved without affecting the integration degree.

In the I/O protection circuit of the semiconductor device of the twelfth aspect, only the NMOS transistors are connected between a power supply and a ground level. Since the NMOS transistors are superior to the PMOS transistors in ESD resistance, it is possible to obtain I/O protection circuits excellent in ESD resistance.

The I/O protection circuit of the semiconductor device of the thirteenth aspect includes the NMOS transistor provided between the power supply wire and the ground wire by a diode connection, and the MOS transistor for I/O protection circuit provided between the external terminal and at least either of the power supply wire and the ground wire. Therefore, when a surge voltage is applied to the external terminal, the discharge current flows through a current path connected between the external terminal, the MOS transistor for I/O protection, one of the power supply wire and the ground wire connected the MOS transistor for I/O protection, the NMOS transistor and the other of the power supply wire and the ground wire. As a result, the surge voltage is always discharged through the NMOS transistor excellent in ESD resistance, making it possible to obtain I/O protection circuits excellent in ESD resistance on SOI substrates.

In the semiconductor device of the fourteenth aspect, the capacitor is added between the power supply and the ground level in the I/O protection circuit. Therefore, a surge voltage can be charged by the capacitor, thereby dispersing the surge voltage.

An object of the present invention is to provide a semiconductor device of SOI structure with improved ESD resistance.

These and other object, features, aspects and advantages of the present invention will become more apparent from the following detailed description of the present invention when taken in conjunction with the accompanying drawings.

BRIEF DESCRIPTION OF THE DRAWINGS

FIG. 23 is a sectional view of an SOI structure;

FIG. 24 is a diagram for explaining a thermal runaway process in a NMOS transistor in a reverse bias connection;

FIG. 25 is a circuit diagram showing an NMOS transistor in a reverse bias connection;

FIG. 26 is a plan view showing a plan structure of an MOS transistor that has been broken by a thermal runaway;

FIG. 27 is a plan view showing a plan structure of a plurality of NMOS transistors connected in parallel between an input and a ground; and FIG. 28 is a circuit diagram showing a circuit structure in FIG. 27.

DESCRIPTION OF THE PREFERRED EMBODIMENTS

The First Preferred Embodiment
The Principle of The Invention

Figure 1:
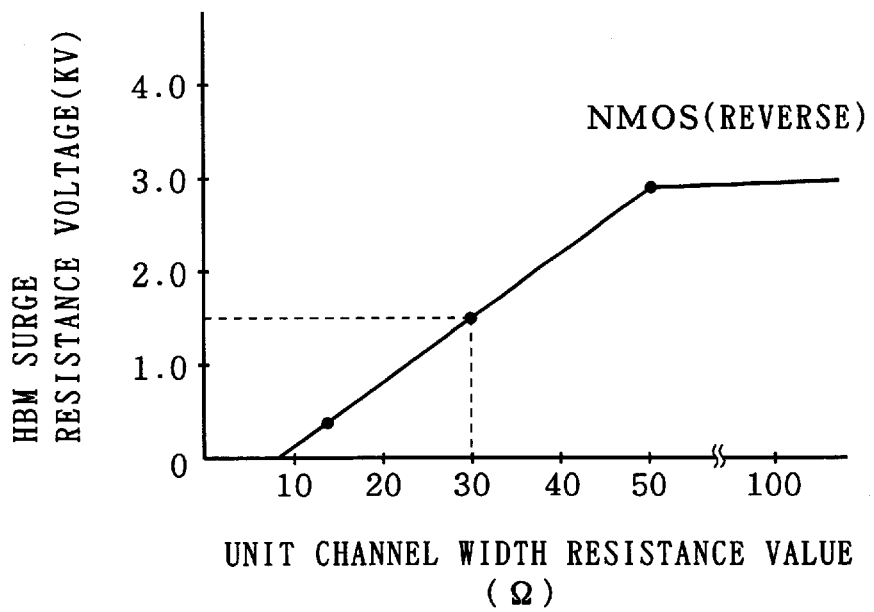
FIG. 1 is a graph diagram showing a characteristic of a surge resistance voltage of an NMOS transistor at the time of reverse bias connection.

FIG. 1 is a graph diagram showing a characteristic of HBM (Human Body Model) resistance of an NMOS transistor that is in a reverse bias connection to an input IN obtained from an external terminal, as shown in FIG. 25. The graph of FIG. 1 is a plot of an HBM surge resistance voltage to a drain resistance value (hereinafter referred to as unit channel width resistance value) per 1 $\mu$m of channel width in an NMOS transistor whose channel width W is 400 $\mu$m and channel length L is 0.6 $\mu$m.

The channel width W adopted for use herein means the total value of each NMOS transistor when a plurality of NMOS transistors are provided in parallel between an input IN and a ground level by a reverse bias. In cases where six NMOS transistors T1 to T6 are used as shown in FIGS. 27 and 28, each gate width of the respective NMOS transistors T1 to T6 is 400/6 $\mu$m.

Referring to FIG. 1, at the time of reverse bias connection, the HBM surge resistance voltage increases in proportion to the unit channel width resistance value in about 10–50 $\Omega$ range of the unit channel width resistance value of drain resistance. Over 50 $\Omega$, the HBM surge resistance voltage stabilizes at about 3.0 KV.

Figure 2:
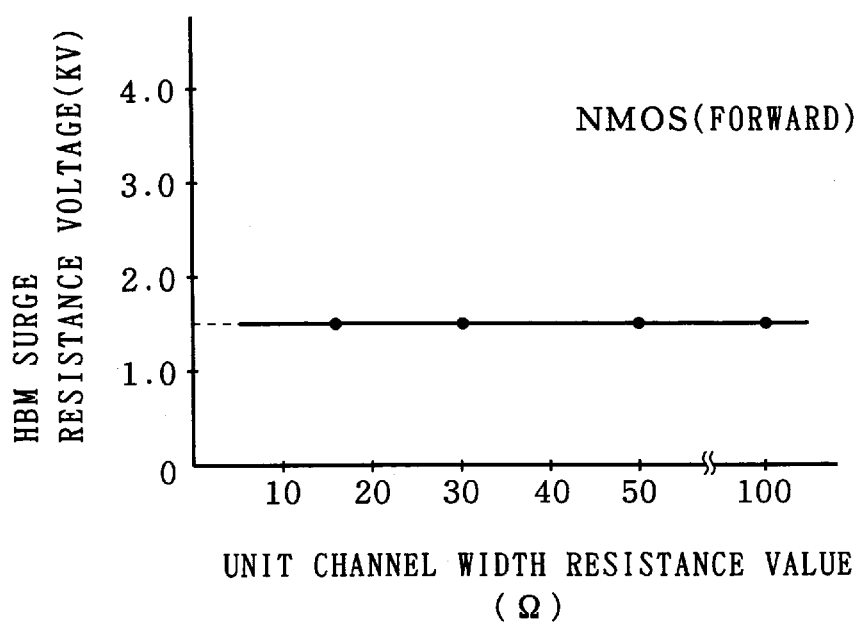
FIG. 2 is a graph diagram showing a characteristic of a surge resistance voltage of an NMOS transistor at the time of forward bias connection.
Figure 3:
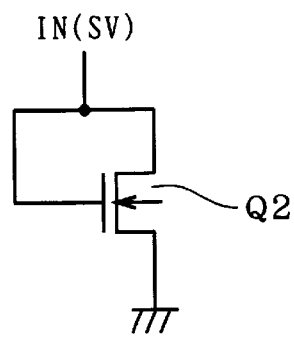
FIG. 3 is a circuit diagram showing an NMOS transistor in a forward bias connection.

FIG. 2 is a graph diagram showing the HBM resistance of an NMOS transistor Q2 connected to an input IN obtained from an external terminal by a forward bias connection as shown in FIG. 3. The graph of FIG. 2 is a plot of the HBM surge resistance voltage to the unit channel width resistance value of drain resistance in an NMOS transistor whose channel width W is 400 $\mu$m and channel length L is 0.6 $\mu$m, as in FIG. 1.

As can be seen from FIG. 2, at the time of forward bias connection, the HBM surge resistance voltage stabilizes at about 1.5 KV, irrespective of the unit channel width resistance value of drain resistance.

Next, description will be given of the reason why, at the time of reverse bias connection, the HBM surge resistance voltage changes with the unit channel width resistance value whereas at the time of forward bias connection, the HBM surge resistance voltage stabilizes irrespective of the unit channel width resistance value.

At the time of reverse bias connection, an NMOS transistor is broken through the process as shown in FIG. 24. However, since the thermal breakdown voltage is lower than a breakdown induced voltage, even if the drain voltage of the NMOS transistor is once lowered after reaching the breakdown voltage to cause an avalanche breakdown, it readily leads to the thermal breakdown voltage by an additional surge voltage SV. This results in an element breakdown due to a thermal runaway as previously mentioned.

Specifically, even though a plurality of NMOS transistors are connected in parallel as shown in FIGS. 27 and 28, if part of which cause an avalanche breakdown, its resistance value is lowered at the same time, the drain voltage of other transistors causing no avalanche breakdown are also lowered, preventing said other transistors from leading to an avalanche breakdown. Then, the flow of current concentrates on the transistors led to the avalanche breakdown. This causes a rise in temperature, readily leading to a thermal breakdown at a thermal breakdown voltage lower than a breakdown induced voltage.

On the other hand, when a plurality of NMOS transistors are connected in parallel at high drain resistance values, even if part of which cause an avalanche breakdown, because of high drain resistance, the resistance value between the source and drain of the NMOS transistors led to the avalanche breakdown is not so lowered. Therefore, it is avoided that the flow of current concentrates on the transistors led to the avalanche breakdown. The degree of temperature rise is low. Thus, a thermal breakdown is suppressed until it reaches a thermal breakdown voltage higher than a breakdown induced voltage.

In addition, since the thermal breakdown voltage is higher than the breakdown induced voltage, all the transistors are to reach an avalanche breakdown before a thermal breakdown phenomenon occurs. Thus, the current can flow uniformly to a plurality of transistors, thereby increasing the ESD resistance.

Figure 4:
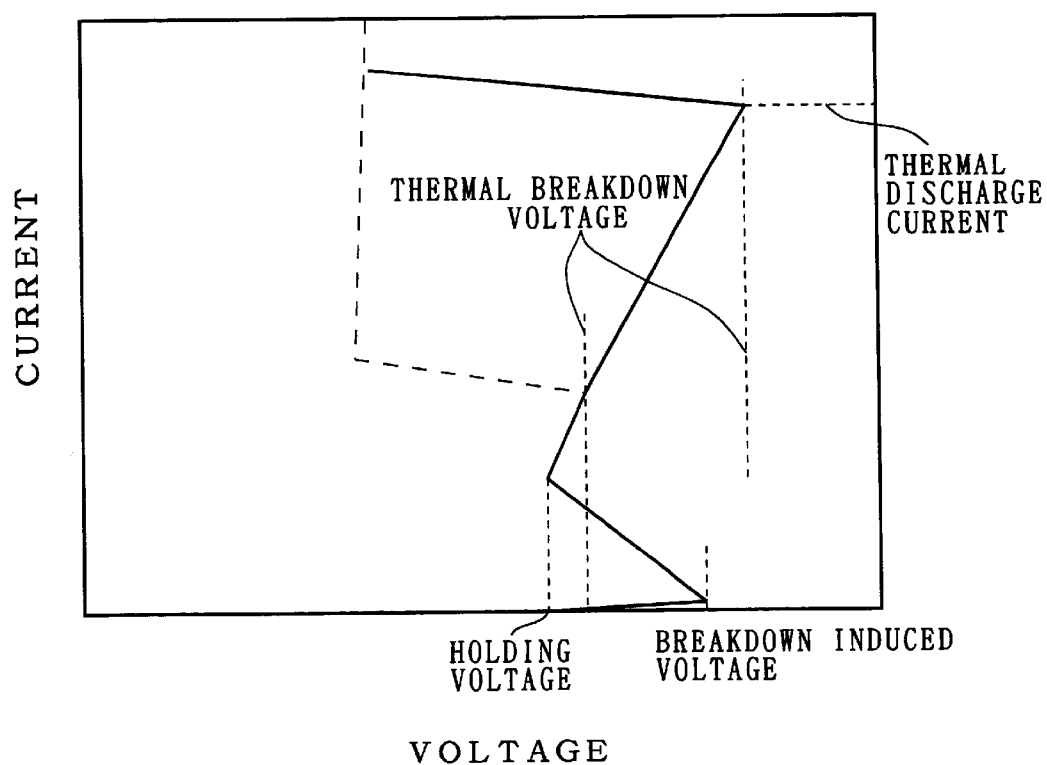
FIG. 4 is a diagram for explaining a thermal runaway process of an NMOS transistor in a reverse bias connection.

That is, relatively high value of each drain resistance of a plurality of NMOS transistors provided in parallel between an input IN and a ground level by a reverse bias connection, prevents the flow of current from concentrating on the transistor that has caused an avalanche breakdown. This enables to set a thermal breakdown voltage higher than a breakdown induced voltage as shown in the solid lines in FIG. 4, thereby improving the ESD resistance. The broken lines of FIG. 4 show cases where a drain resistance is relatively low.

From the above reason, it is evident that the HBM resistance can be improved by setting the unit channel width resistance of drain resistance to greater values at the time of reverse bias connection. The graph of FIG. 1 shows that the saturated value of 3.0 KV can be obtained by setting the unit channel width resistance value of drain resistance to 50 Ω or more. In other words, the unit channel width resistance value of not less than 50 Ω permits a plurality of NMOS transistors to produce a uniform discharge, allowing all the transistors to display their full range of discharge capability.

Figure 5:
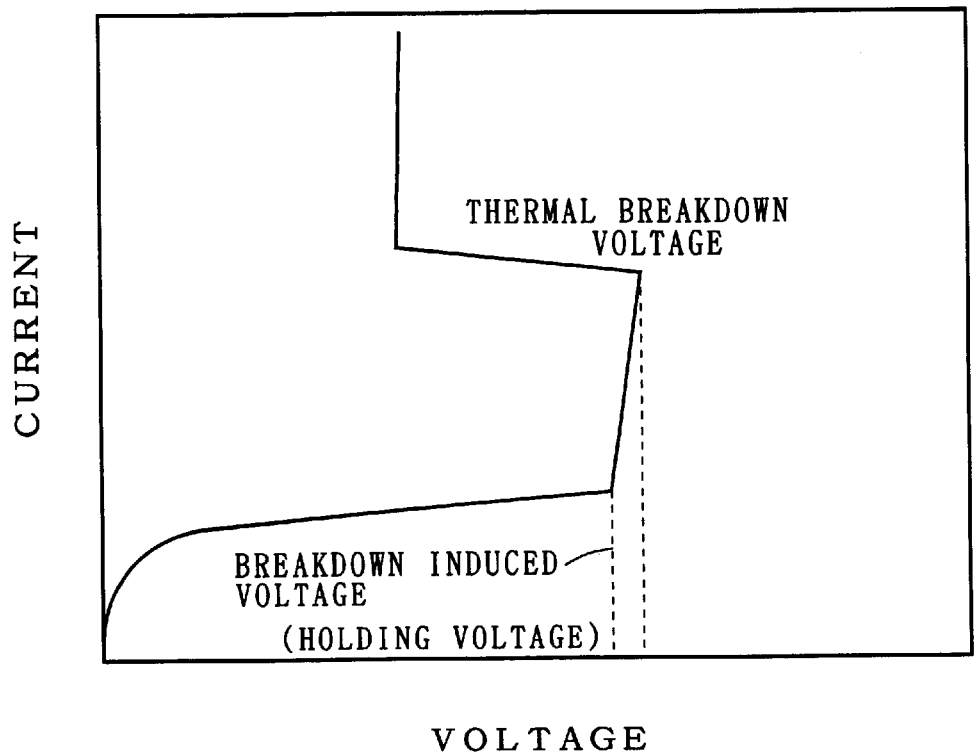
FIG. 5 is a diagram for explaining a thermal runaway process of an NMOS transistor in a forward bias connection.
Figure 6:
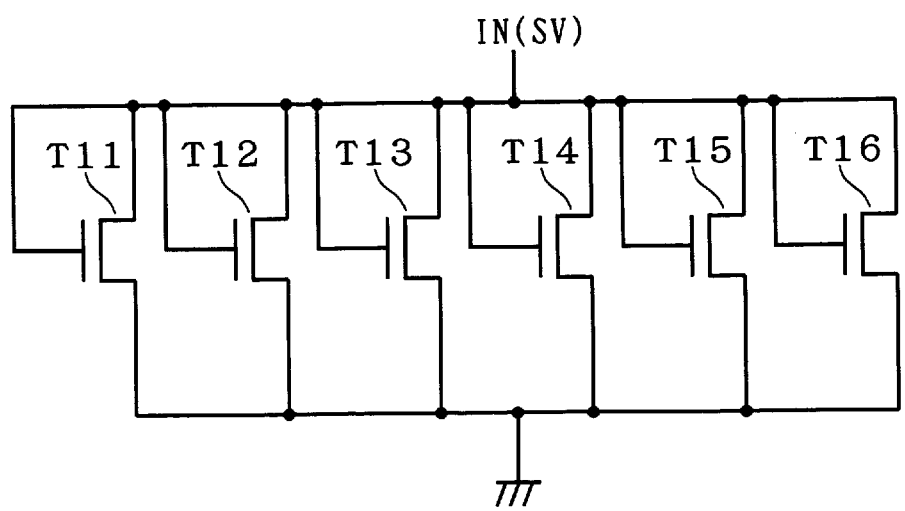
FIG. 6 is a circuit diagram showing a structure for making a forward bias connection utilizing a plurality of NMOS transistors.

FIG. 5 is a graph diagram showing a discharge characteristic at the time of forward bias connection shown in FIG. 3. As can be seen from FIG. 5, at the time of forward bias connection there occurs no snap back phenomenon that upon reaching a breakdown induced voltage, the drain voltage is lowered. Accordingly, as shown in FIG. 6, a plurality of NMOS transistors T11 to T16 provided between an input IN and a ground level cause an avalanche breakdown nearly uniformly when a surge voltage SV is applied. Then, an additional surge voltage SV leads to a thermal breakdown voltage, resulting in a thermal runaway state as in a reverse bias connection.

Thus, at the time of forward bias connection, the HBM surge resistance voltage is unchanged by changing the unit channel width resistance value of the drain resistance of NMOS transistors. The reason for this is as follows: Since the thermal breakdown voltage is higher than the breakdown induced voltage, irrespective of the unit channel width resistance value, when a plurality of NMOS transistors are connected in parallel as shown in FIG. 6, part of which cause an avalanche breakdown and also other transistors that have caused no avalanche breakdown as the drain voltage increases, will immediately lead to an avalanche breakdown. As a result, all the transistors cause an avalanche breakdown, allowing the current to flow uniformly to every transistor. This results in a thermal breakdown at a thermal breakdown voltage higher than a breakdown induced voltage.

As described, forward bias connections are by nature free from the phenomenon that the flow of current concentrates on a transistor led to an avalanche breakdown, unlike reverse bias connections. Therefore, the HBM surge resistance voltage is constant irrespective of the unit channel width resistance value, as shown in FIG. 2.

Figure 7:
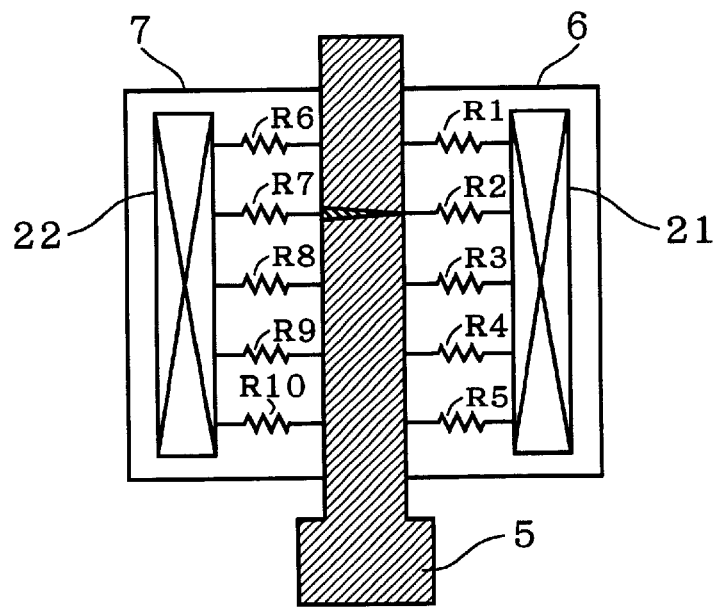
FIG. 7 is a plan view showing a typical plan structure of an NMOS transistor used for an I/O protection circuit of a semiconductor device according to a first preferred embodiment of the present invention.

Normally, I/O protection characteristics call for an ESD resistance needed in both forward and reverse bias connections. For this, a first preferred embodiment is directed to a semiconductor device of SOI structure in which the ESD resistance in a reverse bias connection is increased to be approximately equal to that in a forward bias connection.
Construction and Operation FIG. 7 is a diagram showing a typical plan structure of an NMOS transistor used in a reverse bias connection of an I/O protection circuit of the first preferred embodiment. In this figure, a drain region 6 and a source region 7 of the NMOS transistor are represented by resistances R1 to R5 and R6 to R10, respectively. The drain region 6 and the source region 7 can be connected to an external wiring through contacts 21 and 22, respectively. Merely the drain resistance value of the drain region 6 may be set to a predetermined value.

In cases where with the total channel width W of 400 μm and the channel length L of 0.6 μm, a plurality of NMOS transistors whose gate is grounded are provided in parallel between an input and a ground levels as shown in FIGS. 27 and 28, and the NMOS transistors exhibit a discharge characteristic as shown in FIG. 1, the unit channel width resistance value of drain resistance is set to about 30 Ω.

When manufacturing resistances R1 to R10 whose unit channel width resistance value is 30 Ω, by a silicide process, the sheet resistance of 2 Ω/□(e.g., titanium silicide whose film thickness is 500 angstrom) requires 15 μm of the distance between a contact portion of a drain region and a gate electrode (channel region), i.e., distance between a gate and a contact. The sheet resistance of 10 Ω/□(e.g., cobalt silicide whose film thickness is 400 angstrom, and titanium silicide whose film thickness is 200 angstrom) requires 3 μm of the distance between a gate and a contact.

The reason why the unit channel width resistance value of drain resistance is set to 30 Ω is that an HBM surge resistance voltage (about 1.5 KV) approximately equal to that in forward bias connections can be expected (see FIGS. 1 and 2). By setting the unit channel width resistance value to over 30 Ω, the HBM surge resistance voltage in reverse bias connections is greater than that in forward bias connections. However, since it is required an ESD resistance for both forward and reverse bias connections, even if an HBM surge resistance voltage greater than that in forward bias connections is set at the time of reverse bias connections, substantial improvement in I/O protection characteristic cannot be attained.

In addition, as the drain voltage increases, the drive capacity of NMOS transistors decreases, reducing its operation speed. It is therefore impractical to increase the drain resistance than necessary.

Taking the above limit conditions into consideration, in a semiconductor of the first preferred embodiment, a drain resistance capable of obtaining an HBM surge resistance voltage equal to that in a forward bias is set at the time of reverse bias connections. This produces the effect that a decrease in operability is minimized to obtain the maximum improvement in I/O protection characteristics.

Even with a silicide protection process in which silicide is not formed partially, a similar effect can be obtained by providing a drain resistance having the unit channel width resistance value of about 30 Ω.

In semiconductor devices formed on SOI substrates, internal circuit portions performing signal processing based on signals from an external terminal preferably have a relatively low drain resistance in terms of operability, whereas I/O protection circuit portions preferably have a relatively high drain resistance as previously mentioned. Thus, when forming NMOS transistors by providing a silicide on source and drain regions, as shown in FIG. 8, it is desirable that in an internal circuit portion 15A, a silicide layer 12 is formed relatively thick to lower the drain resistance, and that in an I/O protection portion 15B, a silicide layer 13 is formed relatively thin to such an extent that a drain resistance can obtain a desired HBM surge resistance voltage.

Figure 8:
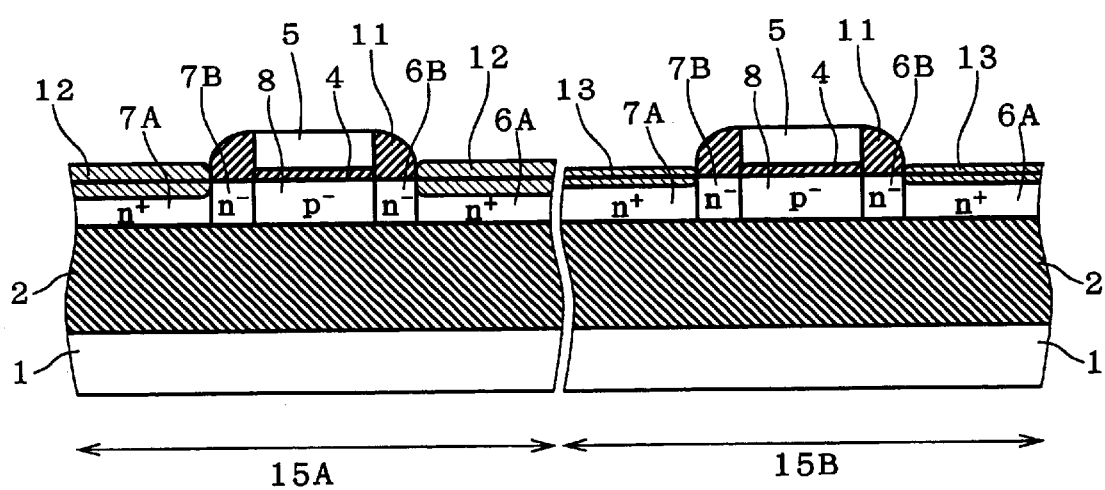
FIG. 8 is a sectional view showing a structure of an NMOS transistor used for an I/O protection circuit of the first preferred embodiment.

Referring to FIG. 8, side walls 11 are formed on the side faces of a gate electrode 5, and silicide layer 12 (13) is formed adjacent to the side walls 11. Underneath the gate electrode 5, the side walls 11, and the silicide layer 12 (13), a p type channel region 8, an $n^+$ drain region 6B (source region 7B), and an $n^+$ drain region 6A (source region 7A) are formed respectively.

A first method of forming a silicide layer 12 and a silicide layer 13 in an internal circuit portion 15A and an I/O protection circuit portion 15B, respectively, so that the silicide layers 12 and 13 differ in film thickness as shown in FIG. 8, is as follows: A drain region 6A (source region 7A) of an internal circuit portion 15A and a drain region 6A (source region 7A) of an I/O protection circuit portion 15B are formed such that the impurity concentration of the latter is higher than that of the former, and then a silicide layer is formed on each of the drain region 6A (source region 7A) of the internal circuit portion 15A and the I/O protection circuit portion 15B at the same time, so that the silicide layer 13 on the I/O protection portion 15B is thinner than the silicide layer 12 on the internal circuit portion 15A.

The reason for this is that in the formation of a silicide layer on a drain (source) region into which impurities have been introduced with high concentrations, by a self-aligned silicide process, its forming speed becomes low, and therefore, a proper manufacturing conditions permits a thinner silicide layer formation.

A second method of forming a silicide layer 12 and a silicide layer 13 in an internal circuit portion 15A and an I/O protection circuit portion 15B, respectively, so that the silicide layers 12 and 13 differ in film thickness, is as follows: A silicide layer is formed relatively thin on the entire surface, followed by a silicide formation processing using a patterning resist in which an opening is present only above the internal circuit portion 15A, so that only the silicide 12 of the internal circuit portion 15A is formed thick.

Snap back phenomenon that the drain voltage is lowered upon reaching a breakdown induced voltage in reverse bias connections, is noticeably generated in NMOS transistors whereas it is seldom generated in PMOS transistors. The reason for this seems that in PMOS transistors holes resist moving from a source to a drain, making it difficult to occur a parasitic bipolar transistor operation. That is, the effect due to the addition of drain resistance, which is the feature of the first preferred embodiment, is greater in NMOS transistors.

Therefore, a semiconductor device may be formed on an SOI substrate by adding a drain resistance only to NMOS transistors among MOS transistors to be formed on an I/O protection circuit portion. For instance, only silicide layers formed on source and drain regions of NMOS transistors in an I/O circuit may be formed thin, or no silicide layer may be formed on source and drain regions of NMOS transistors.

The Second Preferred Embodiment
The Principle

In order to improve ESD resistance, there are often employed a silicide protection method in which no silicide is formed on an I/O protection circuit portion. However, if transistors formed by the silicide protection method are operated as an I/O buffer, its operation speed becomes low because the resistance value between a source and a drain is relatively high.

For SOI structures, an SOI layer 3 is thin, i.e., 100 nm in film thickness. Therefore, by an ion implantation for forming source and drain regions, the SOI layer 3 becomes amorphous state in the direction of its entire film thickness, which is then entirely polycrystalized by the following heat processing. This increases the drain resistance value, normally leading to a sheet resistance value ranging 50–1000 $\Omega/\Box$. The unit channel width resistance value per 1 $\mu m$ of channel width W of MOS transistors whose channel length L is 0.3–0.5 $\mu m$, is about 1000 $\Omega$. Accordingly, in cases where the distance from a gate to a contact, i.e., from an external contact portion of a drain region to a channel region (gate electrode), is 1 $\mu m$ and the sheet resistance is 1000 $\Omega/\Box$, under the operation at the same voltage, the current value is about one second and the speed capability is one second that in cases where the drain resistance value is negligibly low.

In consideration of these points, a second preferred embodiment is directed to reduce the drain resistance of MOS transistors in semiconductor devices of SOI structure that are formed by a silicide protection.

Construction and Operation

In semiconductor devices of the second preferred embodiment, in order to reduce the drain resistance of the silicide protection portion in which no silicide layer is formed, the amount of impurity implantation to source and drain regions of the silicide protection portion is increased.

Figure 9:
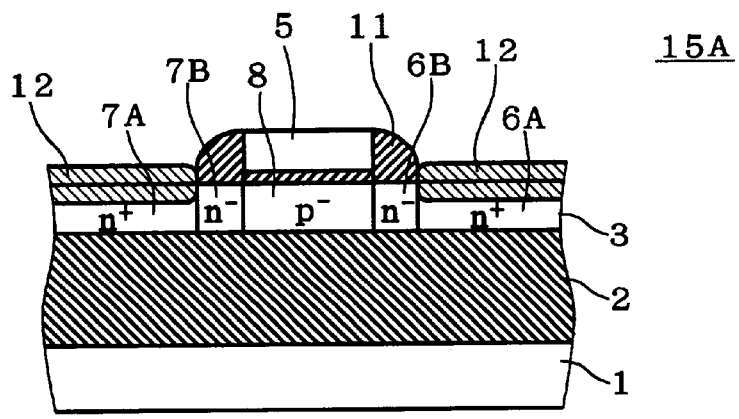
FIG. 9 is a sectional view showing a structure of an NMOS transistor used for an internal circuit portion of a second preferred embodiment of the present invention.
Figure 10:
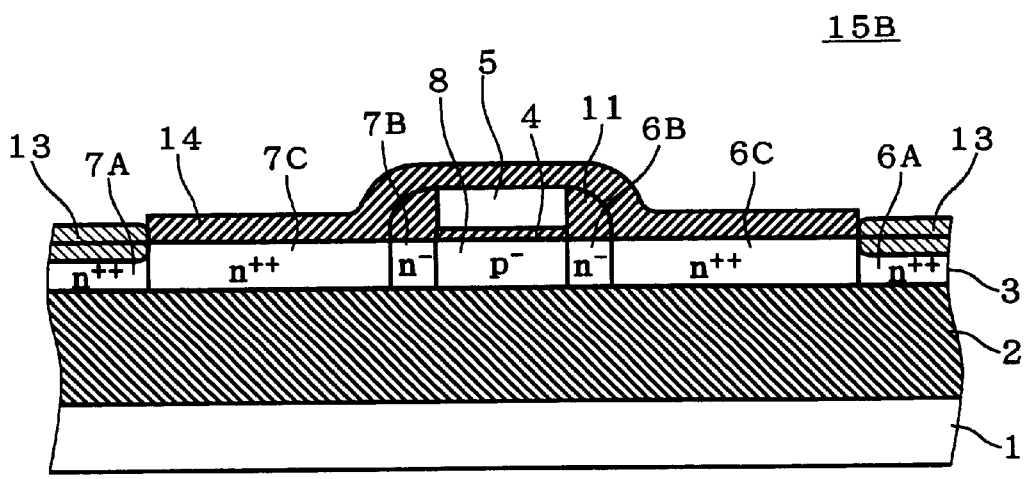
FIG. 10 is a sectional view showing a structure of an NMOS transistor used for an I/O protection circuit portion of the second preferred embodiment.
Figure 11:
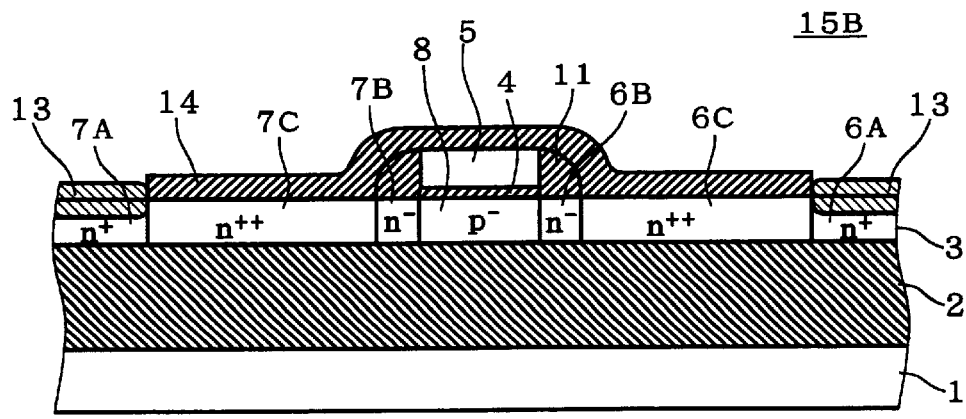
FIG. 11 is a sectional view showing another structure of an NMOS transistor used for an I/O protection circuit of the second preferred embodiment.

FIGS. 9 and 10 are a sectional view showing a structure of a semiconductor device of the second preferred embodiment. In an internal circuit portion 15A, an NMOS transistor is formed without silicide protection portion, as shown in FIG. 9. In an I/O protection circuit portion 5B, an NMOS transistor is formed together with a silicide protection layer 14, as shown in FIG. 10.

Referring to FIG. 9, side walls 11 are formed on the side faces of a gate electrode 5, and a silicide layer 12 is formed adjacent to the side walls 11. Underneath the gate electrode 5 (gate oxide film 4), the side walls 11, and the silicide layer 12, a $p^-$ type channel region 8, an $n^+$ type drain region 6B (source region 7B), and an $n^+$ drain region 6A (source region 7A) are formed respectively.

Referring to FIG. 10, side walls 11 are formed on the side faces of a gate electrode 5. A silicide protection layer 14 is formed adjacent to the side walls 11 so as to cover the gate electrode 5 and the side walls 11. A silicide 13 is formed adjacent to the silicide protection layer 14. Underneath the gate electrode 5 (gate oxide film 4), the side walls 11, the silicide protection layer 14, and the silicide layer 13, a $p^-$ type channel region 8, an $n^-$ type drain region 6B (source region 7B), an $n^{++}$ drain region 6C (source region 7C), and an $n^{++}$ drain region 6A (source region 7A), are formed respectively.

It is noted that the impurity concentration of the drain region 6C (source region 7C) of the I/O protection circuit portion 15B is higher than that of the drain region 6A (source region 7A) of the inter circuit portion 15A.

For instance, if the amount of impurity implantation to the drain region 6A (source region 7A) of the internal circuit portion 15A is set to $1-4 \times 10^{15}/cm^2$, that of the drain region 6C (source region 7C) of the I/O protection circuit portion 15B is set to $5-20 \times 10^{15}/cm^2$.

In a multicrystalized SOI layer 3, implanted impurities are trapped by grain boundaries, it is therefore required to implant more impurities compared to that for a single crystal layer one. However, if formed the drain region 6A (source region 7A) in impurity concentrations over $1 \times 10^{16}/cm^2$, the formation of silicide to be provided thereon will be affected. The worst of it is that a layer of silicide is peeled off. Therefore, when forming the drain region 6C (source region 7C) in impurity concentrations over $1 \times 10^{16}/cm^2$, it is desirable that the impurity concentration of the drain region 6A (source region 7A), upon which a silicide layer 13 will be formed, does not exceed $1 \times 10^{16}/cm^2$, i.e., to be lower than that of the drain region 6C (source region 7C).

The Third Preferred Embodiment
The Principle

In order that PMOS transistors have a low ESD discharge capability and have an ESD resistance equal to that of NMOS transistors, its channel width is required to be greater than that of NMOS transistors. For instance, the channel width required for LDD structures is twice that required for NMOS transistors. This necessitates much forming area, which is disadvantage. Thus, a third preferred embodiment is directed to strike a balance between NMOS transistors and PMOS transistors used for I/O protection circuits in semiconductor device on SOI substrates, while improving the ESD resistance of the PMOS transistors.

The First Aspect

Figure 12:
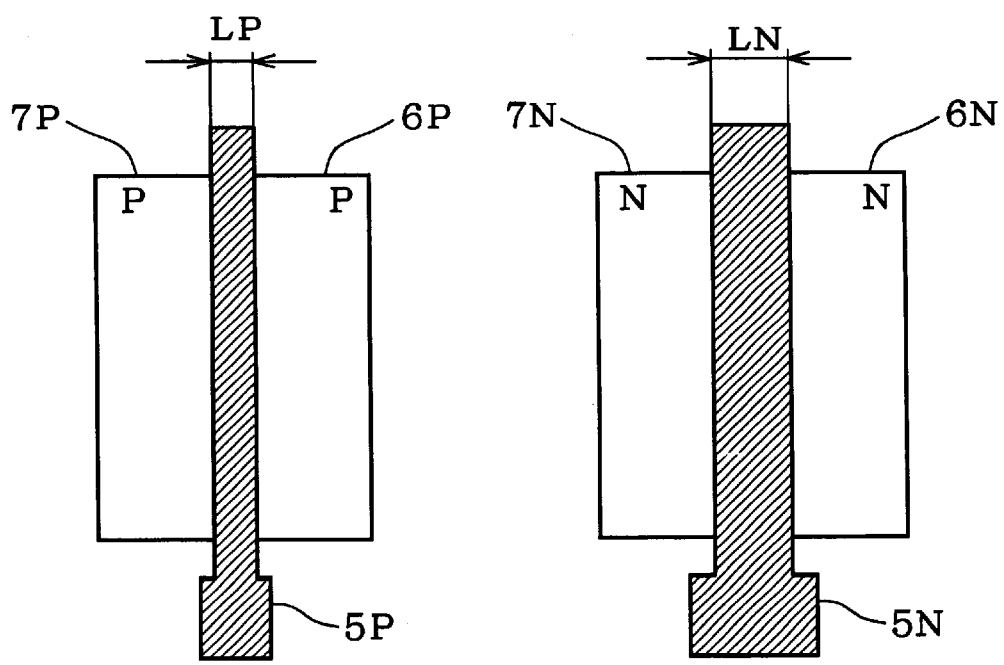
FIG. 12 is a plan view showing a plan structure of a PMOS transistor and an NMOS transistor used in a first aspect of a third preferred embodiment of the present invention.

FIG. 12 is a plan view showing a first aspect of the third preferred embodiment. In this figure, a PMOS transistor has a gate 5P, a drain region 6P, and a source region 7P; and an NMOS transistor has a gate 5N, a drain region 6N, and a source region 7N. As shown in FIG. 12, in order that the PMOS transistor has an ESD resistance equal to that of the NMOS transistor, a channel length LP of the PMOS transistor is shorter than a channel length LN of the NMOS transistor. This increases the discharge capability of the PMOS transistor (i.e., a decrease in holding voltage or breakdown induced voltage), and also reduces its forming area.

The Second Aspect

Figure 13:
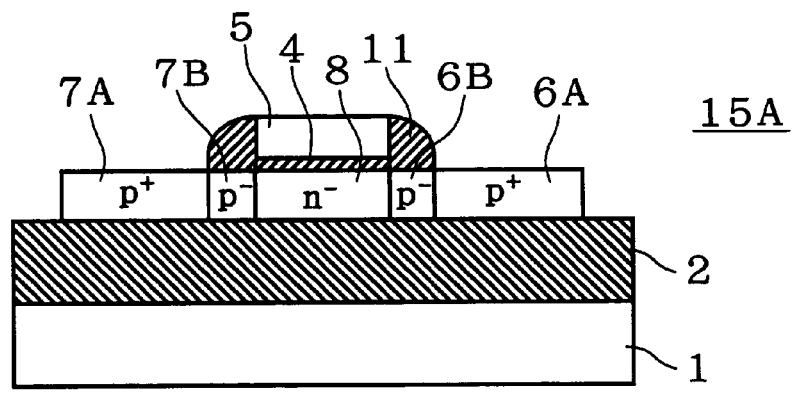
FIG. 13 is a sectional view showing a structure of a PMOS transistor used for an internal circuit portion of a second aspect of the third preferred embodiment.
Figure 14:
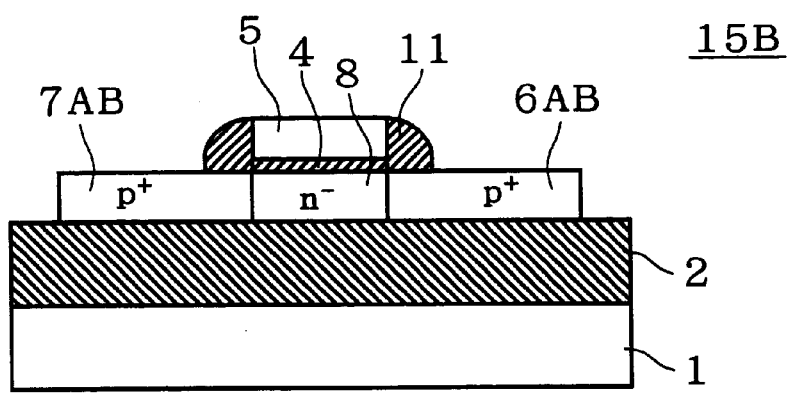
FIG. 14 is a sectional view showing a structure of a PMOS transistor used for an I/O protection circuit portion of the second aspect of the third preferred embodiment.

FIGS. 13 and 14 are a sectional view showing a second aspect of the third preferred embodiment: FIG. 13 shows a PMOS transistor formed on an internal circuit portion 15A; and FIG. 14 shows a PMOS transistor formed on an I/O protection circuit portion 15B.

Referring to FIG. 13, side walls 11 are formed on the side faces of a gate electrode 5 in the internal circuit portion 15A. Underneath the gate electrode 5 (gate oxide film 4) and the side walls 11, an n⁻ type channel region 8 and a p⁻ type drain region 6B (source region 7B) are formed respectively. Adjacent to the drain region 6B (source region 7B), a p⁺ type drain region 6A (source region 7A) is formed.

Referring to FIG. 14, side walls 11 are formed on the side faces of a gate electrode 5 in the I/O protection portion 15B. An n⁻ type channel region 8 is formed underneath the gate electrode 5 (gate oxide film 4). Adjacent to the channel region 8B, a p⁺ type drain region 6AB (source region 7AB) is formed. That is, the p type impurity concentration beneath the side walls 11 is set to be higher than that of the drain region 6B (source region 7B) of the internal circuit portion 15A.

As a result, a PN junction between the drain region 6AB (source region 7AB) and the channel region 8 becomes abrupt to decrease the breakdown induced voltage, thus improving the discharge capability.

The Third Aspect

Figure 15:
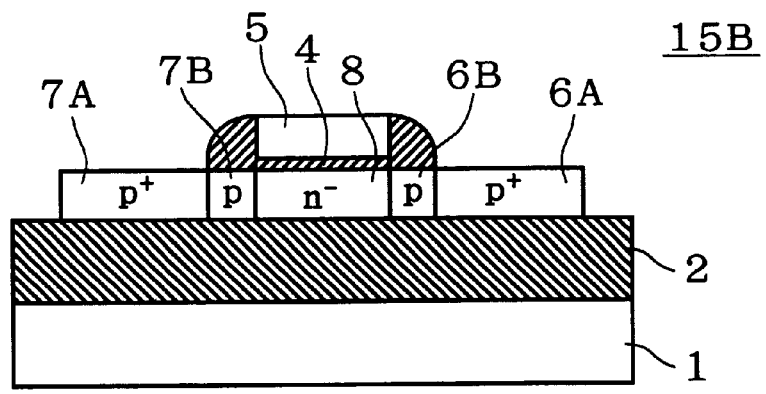
FIG. 15 is a sectional view showing a structure of a PMOS transistor used for an I/O protection circuit portion in a third aspect of the third preferred embodiment.

FIG. 15 is a sectional view showing a third aspect of the third preferred embodiment. In the figure, a PMOS transistor formed on an I/O protection circuit portion 15B is shown.

Referring to FIG. 15, side walls 11 are formed on the side faces of a gate electrode 5 in the I/O protection circuit portion 15B. Underneath the gate electrode 5 (gate oxide film 4) and the side walls 11, an n⁻ type channel region 8 and a p type drain region 6B (source region 7B) are formed respectively. Adjacent to the drain region 6B (source region 7B), a p⁺ type drain region 6A (source region 7A) is formed. A PMOS transistor formed in an internal circuit portion 15A is the same as in FIG. 13.

As a result, a PN junction between the drain region 6B (source region 7B) and the channel region 8 of the PMOS transistor in the I/O protection circuit portion 15B is more abrupt than a PN junction between the drain region 6B (source region 7B) and the channel region 8 of the PMOS transistor in the internal circuit portion 15A. This reduces the breakdown induced voltage to improve the discharge capability.

The Fourth Aspect

Figure 16:
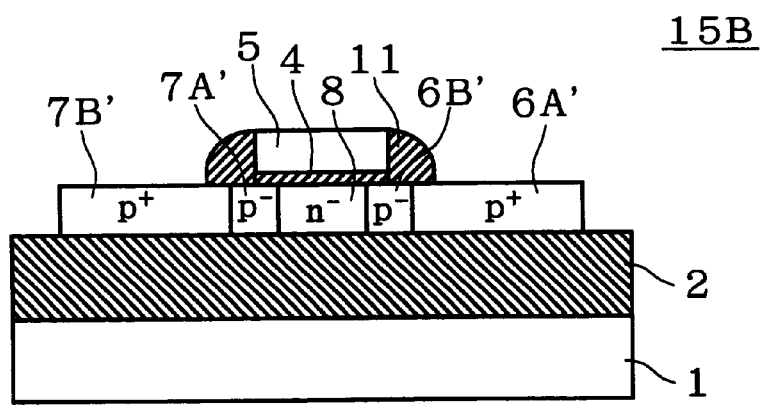
FIG. 16 is a sectional view showing a structure of a PMOS transistor used for an I/O protection circuit portion in a fourth aspect of the third preferred embodiment.

FIG. 16 is a sectional view showing a fourth aspect of the third preferred embodiment. In the figure, a PMOS transistor formed on an I/O protection circuit portion 15B is shown.

Referring to FIG. 16, side walls 11 are formed on the side faces of a gate electrode 5 in the I/O protection circuit portion 15B. Underneath the gate electrode 5 (gate oxide film 4), an n⁻ type channel region 8 is formed. Underneath a region across portions of the gate electrode 5 and the side walls 11A, a p⁻ type drain region 6B' (source region 7B') is formed. Adjacent to the drain region 6B' (source region 7B'), a p⁺ type drain region 6A' (source region 7A') is formed. A PMOS transistor formed in an internal circuit portion 15A is the same as in FIG. 13. The formations of the drain regions 6A', 6B', and the source regions 7A', 7B', are attained by an oblique ion implantation.

As a result, the channel length (effective channel length) of the channel region 8' of the PMOS transistor in the I/O protection circuit 15B is short to improve the discharge capability of the PMOS transistor.

Other Aspects

There are other aspects as follows: by using side walls 11 of an internal circuit portion as a mask, a p⁺ ion implantation is performed to make a graded junction due to its dispersion, thereby obtaining an I/O protection circuit portion of single drain structure, as shown in FIG. 14; an LDD structure in which the impurity concentration of a drain region 6B (source region 7B) adjacent to a channel region 8 is high, as shown in FIG. 15; and the effective channel length is reduced by an oblique ion implantation, as shown in FIG. 16. These other aspects can also improve the discharge capability of PMOS transistors as in the first to third aspect as described above.

The Fourth Preferred Embodiment

The Principle

I/O protection circuits on SOI substrates have the problem that PMOS transistors are inferior to NMOS transistors in ESD resistance (ESD discharge capability). A fourth preferred embodiment is directed to form I/O circuits for SOI substrate by employing NMOS transistors excellent in ESD resistance.

The First Aspect

Figure 17:
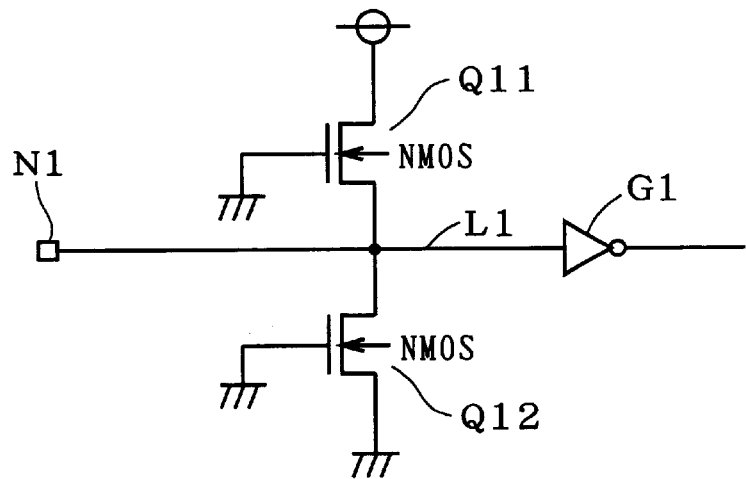
FIG. 17 is a circuit diagram showing a circuit structure of a first aspect of an I/O protection circuit of a semiconductor device according to a fourth preferred embodiment of the present invention.

FIG. 17 is a circuit diagram showing an I/O protection circuit according to a first aspect of the fourth preferred embodiment. As shown in FIG. 17, an input voltage IN is applied to a signal wire L1 through an I/O terminal N1, and then transferred to an input circuit (not shown) through an inverter G1 serving as an input buffer.

An I/O protection circuit of the first aspect comprises NMOS transistors Q11 and Q12. In the NMOS transistor Q11, a drain is connected to a power supply, a gate is grounded, and a source is connected to the signal wire L1. In the NMOS transistor Q12, a drain is connected to the signal wire L1, and a gate and a source are grounded. That is, the I/O protection circuit is made up of a reverse bias connection in which the NMOS transistors Q11 and Q12 that are always in off state are connected to the power supply side and the ground side, respectively.

Unlike devices formed on normal bulk substrates, SOI structures have no diode between a power supply an a ground. It is therefore desired to intentionally add a diode. However, by providing an NMOS transistor with a high discharge capability therebetween, instead of a diode, it is possible to form I/O protection circuits excellent in ESD resistance with a high integration degree, without increasing the gate width of the transistor.

The Second Aspect

In the construction where a power supply and a ground level are connected in common through a power supply wire L11 and a ground wire L12, respectively, if provided an NMOS transistor between the power supply wire L11 and the ground wire L12, either of an NMOS transistor and a PMOS transistor can be used, as an input protection transistor, between an input and the power supply wire 11, and between an input and the ground wire L12.

Figure 18:
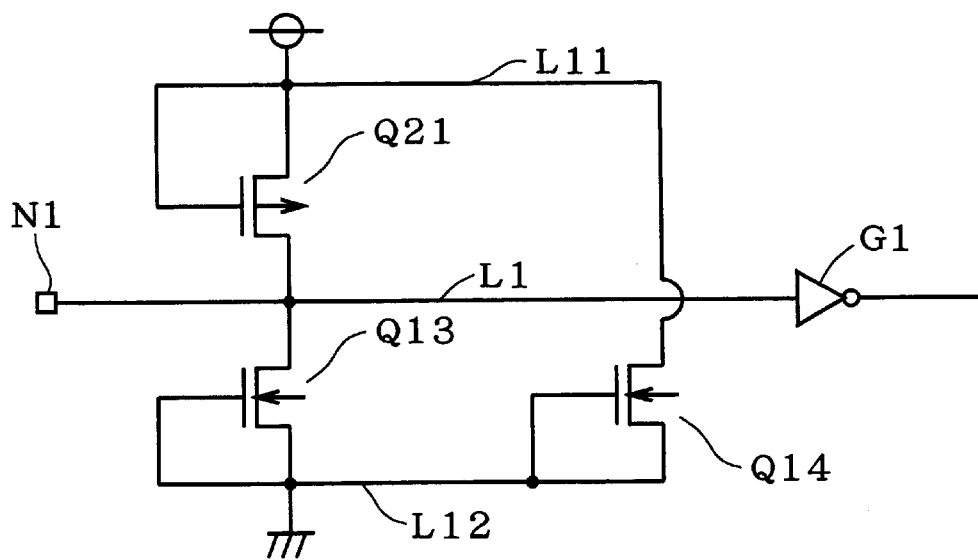
FIG. 18 is a circuit diagram showing a circuit structure of a second aspect of an I/O protection circuit of a semiconductor device according to the fourth preferred embodiment.

With a second aspect shown in FIG. 18, even if between a power supply wire L11 and a signal wire L1, a PMOS transistor Q21 whose gate is connected the power supply wire L11 is provided, and between the signal wire L1 and a ground wire L12, an NMOS transistor Q13 whose gate is connected to the ground wire L12 is provided, an NMOS transistor Q14 whose gate is grounded and discharge capability is high, may be provided between the power supply wire L11 and the ground wire L12.

With the structure in FIG. 18, even if a surge voltage is applied to an input terminal N1, it is possible to discharge it in a ground level through the signal wire L1, the PMOS transistor Q21, the power supply wire L11, the NMOS transistor Q14, and then the ground wire L12, and to discharge it in a power supply through the signal wire L1, the NMOS transistor Q13, the ground wire L12, the NMOS transistor Q14, and then the power supply wire L11.

Thus, providing the NMOS transistor Q14 in a diode connection between the power supply wire L11 and the ground wire L12, enables to obtain I/O protection circuits that exhibit excellent ESD resistance on SOI substrates.

The Third Aspect

Figure 19:
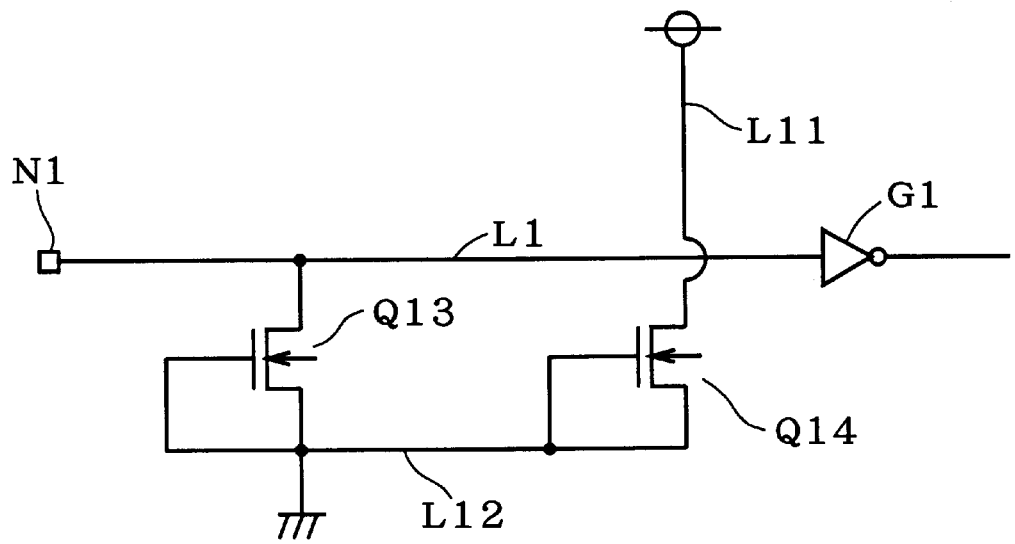
FIG. 19 is a circuit diagram showing a circuit structure of a first example of a third aspect of an I/O protection circuit according to the fourth preferred embodiment.
Figure 20:
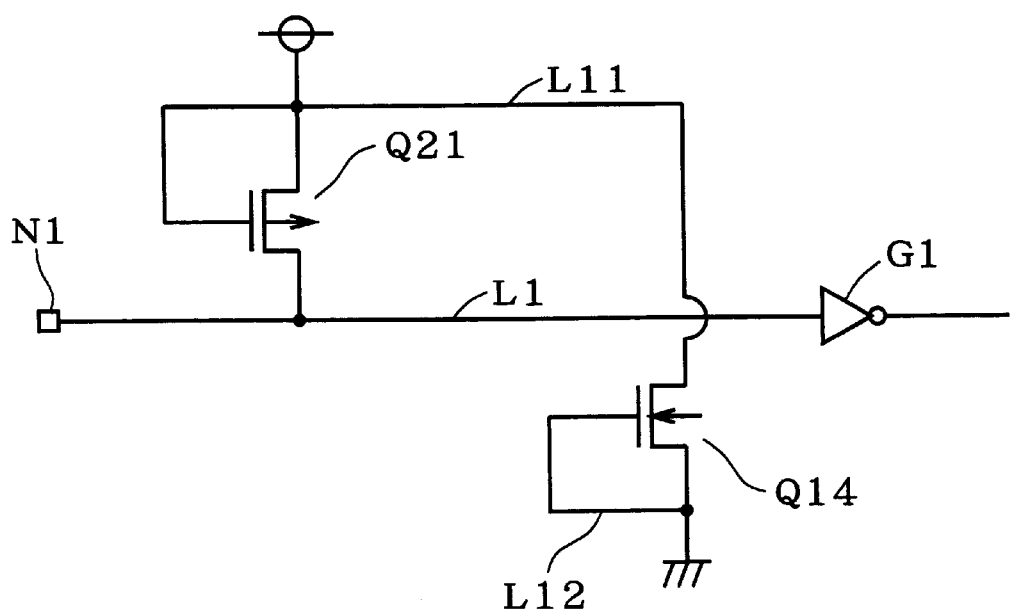
FIG. 20 is a circuit diagram showing a circuit structure of a second example of the third aspect of an I/O protection circuit according to the fourth preferred embodiment.
Figure 21:
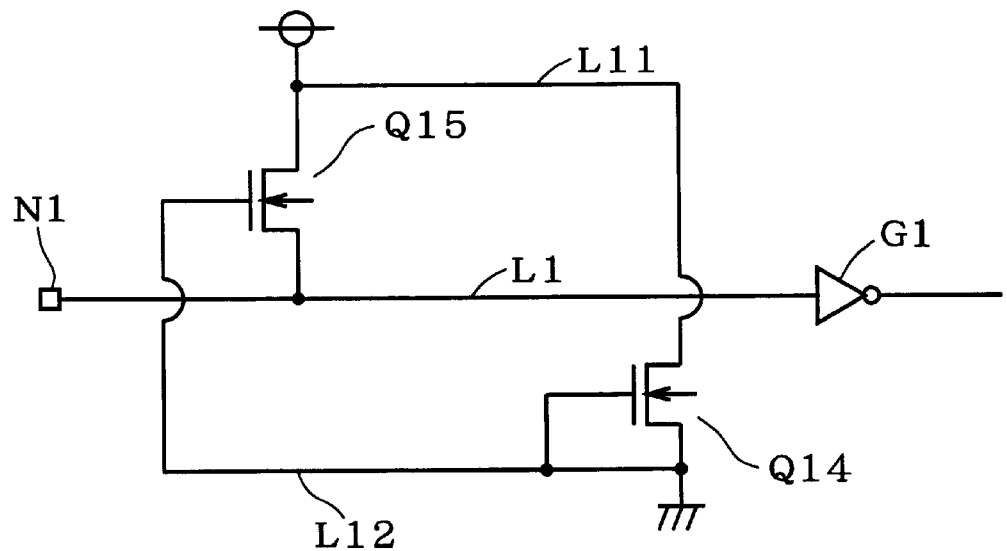
FIG. 21 is a circuit diagram showing a circuit structure of a third example of the third aspect of an I/O protection circuit according to the fourth preferred embodiment.

Referring to FIGS. 19 to 21, when an NMOS transistor is provided in a diode connection between a power supply and a ground wire L12, an input protection transistor may be provided either between an input and a power supply wire L11 or between the input and the ground wire L12. FIGS. 19 to 21 show a structure where an NMOS transistor Q14 whose gate is grounded is provided between the power supply wire L11 and the ground wire L12. Specifically, in the structure of FIG. 19, only an NMOS transistor Q13 whose gate is connected to a ground wire L12 is provided between a signal wire L1 and a ground wire L12. In the structure of FIG. 20, only a PMOS transistor Q21 whose gate is connected to a power supply wire L11 is provided between a signal wire L1 and the power supply wire L11. In the structure of FIG. 21, only an NMOS transistor Q15 whose gate is connected to a ground wire L12 is provided between a signal wire L1 and a power supply wire L11.

With the structure of FIG. 19, even if a surge voltage is applied to an input terminal N1, it is possible to discharge it in a power supply through the signal wire L1, the NMOS transistor Q13, the ground wire L12, the NMOS transistor Q14, and then the power supply wire L11.

With the structure of FIG. 20, even if a surge voltage is applied to an input terminal N1, it is possible to discharge it in a ground level through the signal wire L1, the PMOS transistor Q21, the power supply wire L11, the NMOS transistor Q14, and then the ground wire L12.

With the structure of FIG. 21, even if a surge voltage is applied to an input terminal N1, it is possible to discharge it in a ground level through the signal wire L1, the NMOS transistor Q15, the power supply wire L11, the NMOS transistor Q14, and then the ground wire L12.

Thus, even with the structure where the input protection transistor is provided either between the input and the power supply wire L11, or between the input and the ground wire L12, it is possible to discharge a surge voltage finally through the NMOS transistor Q14, leading to satisfactorily high ESD resistance.

The Fourth Aspect

Figure 22:
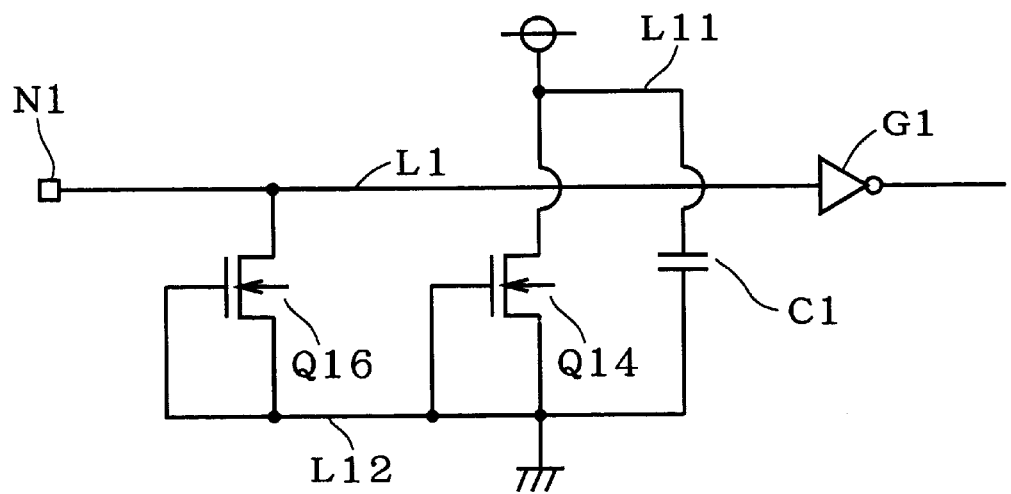
FIG. 22 is a circuit diagram showing a circuit structure of the third aspect of an I/O protection circuit according to the fourth preferred embodiment.

Referring to FIG. 22 showing a fourth aspect, a capacitor may be intentionally added between a power supply wire L11 and a ground wire L12. The gate capacity of a MOS transistor may be utilized as a capacitor.

In the structure of FIG. 22, an NMOS transistor Q14 whose gate is connected to the ground wire L12 is provided between a power supply wire L11 and a ground wire L12, an NMOS transistor Q16 whose gate is connected to the ground wire L12 is provided between a signal wire L1 and the ground wire L12, and a capacitor C1 is provided between the power supply wire L11 and the ground wire L12.

With the above structure, a surge voltage can be dispersed by making the capacitor C1 charge the surge voltage transferred to the power supply wire L11 or the ground wire L12.

Although the fourth preferred embodiment does not refer to the structure in which a resistance (rush resistance) is provided between an input and an input protection transistor, and the structure in which an internal resistance is provided between a discharge element and an internal circuit, these resistances can be provided to increase the ESD resistance.

Relevance between The Fourth Preferred Embodiment and The First to Third Preferred Embodiments As the NMOS transistors Q11 to Q16 in the fourth preferred embodiment, the NMOS transistor of SOI structure used in the first and second preferred embodiments may be employed. But when employing the NMOS transistor of the first preferred embodiment, portions in which a single NMOS transistor is formed should be replaced with a plurality of NMOS transistors in parallel connection.

As the PMOS transistors Q21 and Q22 in the fourth preferred embodiment, the PMOS transistor of SOI structure used in the first to third preferred embodiments may be employed. But when employing the PMOS transistor of the first preferred embodiment, portions in which a single PMOS transistor is formed should be replaced with a plurality of NMOS transistors in parallel connection.

While the invention has been described in detail, the foregoing description is in all aspects illustrative and not restrictive. It is understood that numerous other modifications and variations can be devised without departing form the scope of the invention.

I claim:

1. A semiconductor device formed on an SOI substrate, said device having an I/O protection circuit portion including at least one first MOS transistor connected to an external terminal by a forward bias, and a plurality of second MOS transistors connected in parallel to said external terminal by a reverse bias, characterized in that a resistance value of each drain resistance of said plurality of second MOS transistors is set so that an ESD (Electro Static Discharge) resistance of said plurality of second MOS transistors is approximately equal to or greater than that of said at least one first MOS transistor.

2. The semiconductor device of claim 1 further comprising an internal circuit portion that performs signal processing based on signals from said external terminal, said internal circuit including an MOS transistor for internal circuit having a conductivity type identical with that of said plurality of second MOS transistors, said MOS transistor for internal circuit having a drain resistance whose resistance value is smaller than that of each drain resistance of said plurality of second MOS transistors.

3. The semiconductor device of claim 2, wherein a plurality of first silicide layers are respectively provided on drain regions of said plurality of second MOS transistors, and a second silicide layer is provided on a drain region of said MOS transistor for internal circuit, said first silicide layers being thinner in thickness than said second silicide layer.

4. The semiconductor device of claim 1, wherein the conductivity type of said at least one first MOS transistor and said plurality of second MOS transistors is n-type.

5. The semiconductor device of claim 4, wherein each resistance value of said plurality of second MOS transistors is not less than 30 Ω per 1 μm of channel width.

6. A semiconductor device formed on an SOI substrate, said device having an I/O protection circuit portion connecting an MOS transistor for I/O protection to an external terminal, and an internal circuit comprising an MOS transistor for internal circuit to perform a prescribed signal processing therein, characterized in that:

a drain region of said MOS transistor for I/O protection has first regions upon which no silicide layer is formed, and a second region upon which a silicide layer is formed; and a drain region of said MOS transistor for internal circuit has a third region upon which a silicide layer is formed;

said first regions being higher in impurity in concentration than said third region.

7. The semiconductor device of claim 6, wherein said second region is lower in impurity concentration than said first regions.

8. A semiconductor device formed on an SOI substrate, said device having an I/O protection circuit portion connecting PMOS and NMOS transistors for I/O protection to an external terminal, wherein the channel region property of said PMOS transistor is set to improve an ESD resistance of said PMOS transistor without affecting an integration degree, and wherein a channel length of said PMOS transistor is shorter than a channel length of said NMOS transistor.

9. A semiconductor device formed on an SOI substrate, comprising:

an I/O protection circuit portion connecting a PMOS transistor for I/O protection to an external terminal, the channel region property of said PMOS transistor being set to improve an ESD resistance of said PMOS transistor without affecting an integration degree; and an internal circuit portion including a PMOS transistor for internal circuit to perform signal processing therein, characterized in that portions adjacent to a channel region in a drain region of said PMOS transistor for I/O protection is higher in-impurity concentration than portions adjacent to a channel region in a drain region of said PMOS transistor for internal circuit.

10. The semiconductor device of claim 8, further comprising an internal circuit portion having a PMOS transistor for internal circuit to perform signal processing therein, characterized in that said PMOS transistor for I/O protection is shorter in channel length than said PMOS transistor for internal circuit.

11. A semiconductor device formed on an SOI substrate, and having an I/O protection circuit corresponding to an external terminal, said I/O protection circuit comprising:

a power supply wire connected to a power supply in common;

a ground wire connected to a ground level in common;

a capacitor provided between said power supply wire and said ground wire;

an NMOS transistor in a diode connection between said power supply wire and said ground wire; and an MOS transistor for I/O protection provided between said external terminal and at least one of said power supply wire and said ground wire.

12. A semiconductor device comprising an SOI substrate, a power supply wire, a ground wire, an external terminal and an I/O protection circuit connected to said external terminal, said I/O protection circuit having only NMOS transistors connected between said power supply wire and said ground wire, characterized in that said NMOS transistors include a first NMOS transistor having a grounded gate electrode and being provided between said external terminal and said power supply wire, and a second NMOS transistor having a grounded gate electrode and being provided between said external terminal and said ground wire.

13. A semiconductor device comprising an SOI substrate, a power supply wire, a ground wire, an external terminal and an I/O protection circuit connected to said external terminal, said I/O protection circuit having only NMOS transistors connected between said power supply wire and said ground wire, characterized in that said power supply wire is connected to a power supply in common, said ground wire is connected to a ground level in common, and only two of said NMOS transistors are provided which include a first NMOS transistor in a diode connection between said power supply wire and said ground wire, and a second NMOS transistor for I/O protection provided between said external terminal and only one of said power supply wire and said ground wire.

14. A semiconductor device formed on an SOI substrate, comprising:

an I/O protection circuit portion including a first MOS transistor connected to an external terminal by a forward bias when applied a surge voltage, and a second MOS transistor connected to said external terminal by a reverse bias when applied the surge voltage; and an internal circuit portion that performs signal processing based on signals from said external circuit, said internal circuit including a third MOS transistor having a conductivity type identical to that of said second MOS transistor; and said third MOS transistor having a drain resistance value smaller than that of a drain resistance of said second MOS transistor.

15. The semiconductor device of claim 14, comprising:

a first silicide layer provided on a drain region of said second MOS transistor, and a second silicide layer provided on a drain region of said third MOS transistor, wherein said first silicide layer is thinner in thickness than said second silicide layer.

16. The semiconductor device of claim 15, wherein the conductivity type of said first MOS transistor and said second MOS transistor is n-type.

17. The semiconductor device of claim 16, wherein a drain resistance value of said second MOS transistor is not less than 30 Ω per 1 $\mu$m of channel width.

18. A semiconductor device formed on an SOI substrate, comprising:

an I/O protection circuit portion including a PMOS transistor connected to an external terminal and an NMOS transistor connected to said external terminal, said PMOS transistor having a channel length shorter than a channel length of said NMOS transistor.

19. A semiconductor device formed on an SOI substrate, comprising:

an I/O protection circuit portion including a first PMOS transistor connected to an external terminal; and an internal circuit portion including a second PMOS transistor configured to perform signal processing therein, said first PMOS transistor having portions of a drain region adjacent to a channel region, higher in impurity concentration than portions of a drain region adjacent to a channel region in said second PMOS transistor.

20. A semiconductor device formed on an SOI substrate, comprising:

an I/O protection circuit portion including a first PMOS transistor connected to an external terminal; and an internal circuit portion including a second PMOS transistor configured to perform signal processing therein, wherein said first PMOS transistor has a shorter channel length than said second PMOS transistor.

* * * * *